(12) United States Patent
Chikara

(10) Patent No.: US 10,316,187 B2
(45) Date of Patent: Jun. 11, 2019

(54) RESIN COMPOSITION, PREPREG, METAL-CLAD LAMINATED PLATE, AND WIRING BOARD

(71) Applicant: KYOCERA Corporation, Kyoto-shi, Kyoto (JP)

(72) Inventor: Chie Chikara, Kirishima (JP)

(73) Assignee: KYOCERA CORPORATION, Kyoto (JP)

( * ) Notice: Subject to any disclaimer, the term of this patent is extended or adjusted under 35 U.S.C. 154(b) by 0 days.

(21) Appl. No.: 15/556,524

(22) PCT Filed: Mar. 9, 2016

(86) PCT No.: PCT/JP2016/057408
§ 371 (c)(1),
(2) Date: Sep. 7, 2017

(87) PCT Pub. No.: WO2016/147984
PCT Pub. Date: Sep. 22, 2016

(65) Prior Publication Data
US 2018/0051170 A1    Feb. 22, 2018

(30) Foreign Application Priority Data

Mar. 13, 2015    (JP) ................ 2015-050905

(51) Int. Cl.
| | | |
|---|---|---|
| *C08L 71/12* | (2006.01) | |
| *B32B 15/08* | (2006.01) | |
| *C08J 5/24* | (2006.01) | |
| *B32B 15/085* | (2006.01) | |
| *C08F 290/06* | (2006.01) | |
| *C08K 3/36* | (2006.01) | |
| *C08K 5/14* | (2006.01) | |
| *C08K 5/3492* | (2006.01) | |
| *H05K 1/05* | (2006.01) | |
| *H05K 1/03* | (2006.01) | |
| *H05K 3/02* | (2006.01) | |

(52) U.S. Cl.
CPC ............ *C08L 71/126* (2013.01); *B32B 15/08* (2013.01); *B32B 15/085* (2013.01); *C08F 290/062* (2013.01); *C08J 5/24* (2013.01); *C08K 3/36* (2013.01); *C08K 5/14* (2013.01); *C08K 5/34924* (2013.01); *H05K 1/0353* (2013.01); *H05K 1/056* (2013.01); *C08J 2371/12* (2013.01); *C08J 2423/26* (2013.01); *C08J 2445/00* (2013.01); *H05K 3/022* (2013.01)

(58) Field of Classification Search
CPC .... C08L 71/126; H05K 1/0353; H05K 1/056; H05K 3/022; C08K 5/14; C08K 5/34924; C08K 3/36; B32B 15/08; B32B 15/085; C08F 290/062; C08J 5/24
See application file for complete search history.

(56) References Cited

U.S. PATENT DOCUMENTS

2013/0180770 A1*    7/2013    Su .................... H05K 3/022
                                                            174/258

FOREIGN PATENT DOCUMENTS

JP      2005-008829 A    1/2005

OTHER PUBLICATIONS

International Search Report, PCT/JP2016/057408, dated May 31, 2016, 2 pgs.

* cited by examiner

*Primary Examiner* — Robert S Jones
(74) *Attorney, Agent, or Firm* — Volpe and Koenig, P.C.

(57) ABSTRACT

A resin composition of the present disclosure contains an ingredient (A) that is a polyphenylene ether whose hydroxyl group bonded to a terminal of a main chain is modified with an ethylenically unsaturated compound, an ingredient (B) that is an olefin resin containing a hydroxyl group or carboxyl group, an ingredient (C) that is at least one kind selected from among triallyl isocyanurate and triallyl cyanurate, and an ingredient (D) that is an organic peroxide.

7 Claims, No Drawings

RESIN COMPOSITION, PREPREG, METAL-CLAD LAMINATED PLATE, AND WIRING BOARD

TECHNICAL FIELD

The present invention relates to a resin composition, a prepreg using the resin composition, a metal-clad laminated plate, and a wiring board.

BACKGROUND ART

Recently, the downsizing, lightening, and thinning of various electronic components have advanced rapidly along with the speeding-up and higher integration of LSIs and the larger capacity of memories. Therefore, excellent heat resistance, dimensional stability, electrical properties, or the like are also demanded in materials therefor.

Thermosetting resins, such as phenol resins, epoxy resins, and polyimide resins, have conventionally been used for printed wiring boards. These resins have various performances in a balanced manner, but have poor dielectric properties in a high frequency range. As a novel material to solve the above problem, polyphenylene ether gathers attention, and attempts have been made to apply polyphenylene ether to a metal-clad laminate (Patent Document 1).

PRIOR ART DOCUMENT

Patent Document

Japanese Unexamined Patent Application Publication No. 2005-8829

SUMMARY OF INVENTION

A resin composition of the present disclosure contains an ingredient (A) that is a polyphenylene ether whose hydroxyl group at bonded to a terminal of a main chain is modified with an ethylenically unsaturated compound; an ingredient (B) that is an olefin resin containing a hydroxyl group or a carboxyl group; an ingredient (C) that is at least one kind selected from among triallyl isocyanurate and triallyl cyanurate; and an ingredient (D) that is an organic peroxide.

A prepreg of the present disclosure includes the resin composition and a base material. A metal-clad laminated plate of the present disclosure includes a conductive metal foil on a surface of the prepreg.

A wiring board of the present disclosure includes a plurality of insulating layers and a conductive layer disposed between the insulating layers. Each of the insulating layers includes the resin composition and a base material.

DETAILED DESCRIPTION OF EMBODIMENTS

A resin composition of the present disclosure contains an ingredient (A) that is a polyphenylene ether whose hydroxyl group at bonded to a terminal of a main chain is modified with an ethylenically unsaturated compound, an ingredient (B) that is an olefin resin containing a hydroxyl group or carboxyl group, an ingredient (C) that is at least one kind selected from among triallyl isocyanurate and triallyl cyanurate, and an ingredient (D) that is an organic peroxide.

The ingredient (A) used for the resin composition of the present disclosure is not particularly limited, and there is, for example, a compound represented by the following formula (I). The compound represented by formula (I) is described in, for example, Japanese Patent No. 4913970.

[Chemical formula 1]

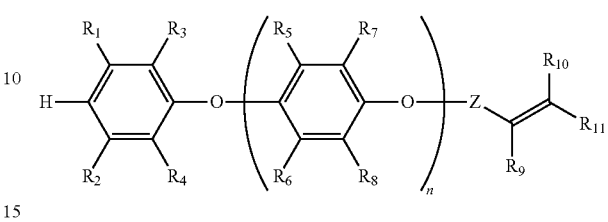

In formula (I), $R_1$ to $R_{11}$ each shows a hydrogen atom, or may have a substituent. The substituent is any one of a linear or branched alkyl group having carbon atoms of 1 to 8, a linear or branched alkenyl group having carbon atoms of 2 to 8, a linear or branched alkynyl group having carbon atoms of 2 to 8, and an aryl group having carbon atoms of 6 to 10.

Examples of other substituents are carboxyl group, aldehyde group, hydroxyl group, and amino group. Z shows carbonyl group ($>C=O$), thiocarbonyl group ($>C=S$), methylene group ($-CH_2-$), ethylene group (dimethylene group) ($-CH_2-CH_2-$), trimethylene group ($-CH_2-CH_2-CH_2-$), or tetramethylene group ($-CH_2-CH_2-CH_2-CH_2-$). "n" shows an integer of 1 to 200.

As an ingredient (A) for use in the resin composition of the present disclosure, there are, for example, compounds represented by the above formula (I) in which $R_1$ to $R_{11}$ each shows a hydrogen atom, a methyl group, an ethyl group, or a phenyl group which may have a substituent.

The content of the ingredient (A) is not particularly limited. When a total amount of the ingredient (A), a later-described ingredient (B), a later-described ingredient (C), and a later-described (D) is 100% by mass, the ingredient (A) may be incorporated in an amount of 19.9-88% by mass. The incorporation of the ingredient (A) in the above amount contributes to reducing dielectric constant and dielectric loss tangent. The ingredient (A) may be incorporated in an amount of 30-73% by mass, and particularly in an amount of 58-66% by mass.

The ingredient (B) for use in the resin composition of the present disclosure functions as ingredients for low dielectric constant and low dielectric loss tangent. The ingredient (B) has a low molecular weight and is therefore capable of being mixed into a mixture of the ingredient (A) and the ingredient (C). When being mixed together, a carbonyl group of triallyl isocyanurate or triallyl cyanurate and a hydroxyl group or carboxyl group which is a modifying group of the olefin resin form a hydrogen bond. This suppresses that a substituent of an unreacted ingredient (C) and a substituent of uncrosslinked part in a crosslinked body of the ingredient (A) and the ingredient (C) exercise in a high frequency environment. This combines with good high-frequency characteristics of the ingredient (B) in terms of material, thereby producing good high-frequency characteristics. Examples of the ingredient (B) include cyclo olefin copolymer and polymethylpentene.

The content of the ingredient (B) is not particularly limited. When a total amount of the ingredient (A), the ingredient (B), a later-described ingredient (C), and a later-described (D) is 100% by mass, the ingredient (B) may be incorporated in an amount of 2.0-20.0% by mass. The incorporation of the ingredient (B) in the above amount contributes to reducing dielectric constant and dielectric loss tangent. The ingredient (B) may be incorporated in an amount of 2.0-10.0% by mass.

The ingredient (C) for use in the resin composition of the present disclosure functions as a crosslinking agent. One or both of triallyl isocyanurate and triallyl cyanurate may be used. Good high-frequency characteristics and heat resistance are producible by using at least one kind selected from among triallyl isocyanurate and triallyl cyanurate.

The content of the ingredient (C) is not particularly limited. When a total amount of the ingredient (A), the ingredient (B), the ingredient (C), and a later-described (D) is 100% by mass, the ingredient (C) may be incorporated in an amount of 9.9-70% by mass. The incorporation of the ingredient (C) in the above amount contributes to producing high heat resistance. The ingredient (C) may be incorporated in an amount of 20-50% by mass.

The ingredient (D) for use in the resin composition of the present disclosure functions as a radical initiator. In other words, the ingredient (D) is used for obtaining a crosslinked product of the ingredient (A), the ingredient (B), and the ingredient (C) by subjecting the ingredients (A), (B), and (C) to a radical reaction. Examples of the ingredient (D) include, without being limited thereto, di-t-butyl peroxide, 2,5-dimethyl-2,5-di(t-butyl peroxide)hexane, and 2,5-dimethyl-2,5-di(t-butyl peroxide)hexyne-3. These compounds are commercially available as, for example, "PERBUTYL D", "PERHEXA 25B", or "PERHEXYNE 25B" (each manufactured by NOF Corporation). Organic peroxides containing no benzene ring are usable as the ingredient (D).

When a total amount of the ingredient (A), the ingredient (B), the ingredient (C), and the ingredient (D) is 100% by mass, the ingredient (D) may be incorporated in an amount of 0.1-10% by mass in the resin composition of the present disclosure. The incorporation of the ingredient (D) in the above amount contributes to an efficient progress of the crosslinking reaction of the ingredient (A), the ingredient (B), and the ingredient (C), thereby reducing dielectric constant and dielectric loss tangent. The ingredient (D) may be incorporated in an amount of 1-6% by mass, and particularly in an amount of 2-4% by mass.

The resin composition of the present disclosure may contain silica, a flame retardant, and a stress reducing agent as necessary, insofar as the effects of the resin composition of the present disclosure are not inhibited. Examples of the silica include pulverized silica and fused silica, which may be used alone or in a combination of two or more kinds. More specifically, examples of the silica include fused silica treated with methacryl silane, "SFP-130MC" (manufactured by Denka Company Limited), and "FUSELEX E-2", "Adma FineSO-05", and "PLV-3" (each manufactured by TATSUMORI LTD.).

Silica particles having an average particle size of 5 µm or less is preferably used as the silica. For example, when the resin composition is used for a metal-clad laminate, it is possible to improve adhesion to a metal foil by using the silica particles having the above average particle size. When a total amount of the ingredient (A), the ingredient (B), the ingredient (C), and the ingredient (D) is 100 parts by mass, the silica may be incorporated in an amount of 5-40 parts by mass. The incorporation of the silica in the above amount contributes to improving melt flow properties of the resin composition, as well as improving the adhesion to the metal foil when the resin composition is used for the metal-clad laminate or the like, thereby improving through-hole connection reliability.

The flame retardant is not particularly limited, and examples thereof include melamine phosphate, melam polyphosphate, melem polyphosphate, melamine pyrophosphate, ammonium polyphosphate, red phosphorus, aromatic phosphate, phosphonate, phosphinate, phosphine oxide, phosphazene, and melamine cyanurate. These flame retardants may be used alone or in a combination of two or more kinds. Melamine pyrophosphate, melamine polyphosphate, melam polyphosphate, or ammonium polyphosphate is usable from the viewpoints of dielectric properties, flame resistance, heat resistance, adhesion, moisture resistance, chemical resistance, reliability, and the like.

When a total amount of the ingredient (A), the ingredient (B), the ingredient (C), and the ingredient (D) is 100 parts by mass, the flame retardant may be incorporated in an amount of 15-45 parts by mass. The incorporation of the flame retardant in the above amount makes it possible to improve flame resistance with little or no influence on dielectric properties, adhesion, and moisture resistance.

The stress reducing agent is not particularly limited, and examples thereof include silicone resin particles. Examples of the silicone resin particles include silicone rubber powders, such as "KMP-597" (manufactured by Shin-Etsu Chemical Co., Ltd.) and "X-52-875" (manufactured by Shin-Etsu Chemical Co., Ltd.), and silicone resin powders, such as "KMP-590" (manufactured by Shin-Etsu Chemical Co., Ltd.) and "X-52-1621" (manufactured by Shin-Etsu Chemical Co., Ltd.). These stress reducing agents may be used alone or in a combination of two or more kinds.

As a stress reducing agent, it is possible to use one which has an average particle size of 10 µm or less. For example, when the resin composition is used for the metal-clad laminate, it is possible to improve the adhesion to the metal foil by using the stress reducing agent having the average particle size. For example, when the resin composition is used for the metal-clad laminate, the incorporation of the stress reducing agent as described above makes it possible to improve the adhesion to the metal foil and resistance to moisture absorption, thereby also improving through-hole connection reliability.

Besides the ingredients as described above, a filler, additives, or the like may be suitably added to the resin composition of the present disclosure according to the purpose of use. Examples of the filler include carbon black, titanium oxide, barium titanate, glass beads, and glass hollow spheres. Examples of the additives include antioxidant, heat stabilizer, antistatic agent, plasticizer, pigment, dye, and coloring agent. Specific examples of the additives include "R-42" (manufactured by Sakai Chemical Industry Co., Ltd.) and "IRGANOX 1010" (manufactured by BASF). The fillers and the additives may be used alone or in a combination of two or more kinds.

At least one of thermoplastic resins and thermosetting resins may be added to the resin composition of the present disclosure. Examples of the thermoplastic resins include GPPS (general purpose polystyrene), HIPS (high impact polystyrene), polybutadiene, and styrene butadiene block copolymer. Examples of the thermosetting resins include epoxy resins. These resins may be used alone or in a combination of two or more kinds.

The resin composition of the present disclosure is obtainable by, for example, mixing together the above-described ingredients (A) to (D) and other ingredients as needed. A mixing method is however not particularly limited. As a mixing method, there for, for example, a solution mixing method of uniformly dissolving or dispersing all the ingredients in a solvent, and a melt-blending method which is carried out using an extruder or the like while heating. Examples of the solvents used in the solution mixing method include aromatic solvents, such as benzene, toluene, and xylene, and tetrahydrofurane. These solvents may be used alone or in a combination of two or more kinds.

The prepreg of the present disclosure is described below. The prepreg of the present disclosure includes the resin composition of the present disclosure and a base material. For example, the prepreg is obtainable by applying the resin composition of the present disclosure to the base material or impregnating the base material with the resin composition of the present disclosure, followed by drying. Examples of the base material include glass, woven or nonwoven fabrics of polyimide fibers, and paper. Examples of glass materials include D glass, S glass, and quartz glass besides usual E glass.

The base material may account for 20-80% by mass of the entire prepreg. In the prepreg of the present disclosure, a coupling agent, such as a silane-type coupling agent and a titanate-type coupling agent, is usable as needed by means of application onto the base material.

The resin composition (ingredients) in the prepreg and the content thereof are checkable by analysis using gas chromatography-mass spectrometry (GC-MS) and nuclear magnetic resonance analysis ($^1$H-NMR and $^{13}$C-NMR), and Fourier transform type infrared absorption spectrometry (FT-IR).

A method for manufacturing the prepreg of the present disclosure is not particularly limited. For example, there is a method including uniformly dissolving or dispersing the resin composition of the present disclosure in a solvent as needed (for example, the above-mentioned aromatic solvent, and ketone-type solvents such as methyl ethyl ketone), and then applying this to the base material or impregnating the base material with this, followed by drying.

Alternatively, the resin composition may be melted, and the base material may be impregnated with the melted resin composition. An application method and an impregnating method are not particularly limited. For example, a solution or dispersion liquid of the resin composition may be applied with a spray, a brush, or a bar coater, or the base material may be dipped in the solution or dispersion liquid of the resin composition (dipping). The application or the impregnation may be repeated several times as needed. The application or the impregnation is repeatable by using a plurality of solutions or dispersion liquids with different resin concentrations.

The prepreg of the present disclosure is processed into a laminated plate by being subjected to, for example, heat forming. The laminated plate is obtainable by, for example, stacking a plurality of the prepregs according to a desired thickness, followed by forming while applying heat and pressure. Alternatively, a thicker laminated plate is also obtainable by combining the obtained laminated plate and another prepreg. Although the laminate forming and curing are usually carried out simultaneously by using a heat press machine, both may be carried out separately.

More specifically, firstly, a semi-cured laminated plate may be obtained by laminate forming, and the semi-cured laminated plate may be completely cured by processing with a heat treatment machine. The forming while applying heat and pressure is performable at 80-300° C. at a pressure of 0.1-50 MPa for approximately 1 minute to approximately 10 hours, or alternatively at 150-250° C. and at a pressure of 0.5-10 MPa for approximately 30 minutes to approximately 5 hours.

The metal-clad laminated plate of the present disclosure is described below. The metal-clad laminated plate of the present disclosure has a conductive metal foil on a surface of the prepreg of the present disclosure. For example, the metal-clad laminated plate of the present disclosure is obtainable by overlapping the prepreg of the present disclosure and the conductive metal foil, followed by forming while applying heat and pressure. The conductive metal foil is not particularly limited, and examples thereof include copper foils, such as an electrolytic copper foil and a rolled copper foil, aluminum foils, and composite foils formed by laminating these metal foils together. The copper foils are preferred among these conductive metal foils. The thickness of the conductive metal foil is not particularly limited, and ones having a thickness of approximately 5-105 µm are usable. The metal-clad laminated plate of the present disclosure is also obtainable by laminating a desired number of the prepregs of the present disclosure and a desired number of the conductive metal foils one upon another, followed by forming while applying heat and pressure. The metal-clad laminated plate of the present disclosure is usable for printed wiring boards or the like.

The wiring board of the present disclosure is described below. The wiring board of the present disclosure includes a plurality of insulating layers and a conductor layer disposed between the insulating layers. The insulating layers are respectively made up of the resin composition of the present disclosure and a base material.

The wiring board of the present disclosure is obtainable by, for example, overlapping the prepreg and an inner layer board in which circuits and through holes are formed on the metal-clad laminated plate of the present disclosure, and then laminating the conductive metal foil on the surface of the prepreg, followed by forming while applying heat and pressure. Alternatively, a multilayer printed wiring board may be made by further forming circuits and through holes on the conductive metal foil lying on the surface.

With the resin composition of the present disclosure, it is possible to reduce dielectric loss tangent. The use of the resin composition makes it possible to obtain the prepreg and the metal-clad laminated plate each having a low dielectric loss tangent, and the wiring board having excellent high frequency characteristics.

EXAMPLES

Although the resin composition of the present disclosure is specifically described with reference to Examples, the resin composition of the present disclosure is not limited to these Examples.

Ingredients used in samples are as follows.

"SA9000": methacryl-modified polyphenylene ether (manufactured by SABIC)

"COC": maleinized modified cycloolefin copolymer (manufactured by Mitsui Chemicals, Inc.)

"TAIC": triallyl isocyanurate (manufactured by Nippon Kasei Chemical Company Limited)

"Perbutyl P": α,α'-di-(t-butylperoxy)diisopropylbenzene (manufactured by NOF Corporation)

"Perhexyne 25B": 2,5-dimethyl-2,5-di(t-butyl peroxide) hexyne-3 (manufactured by NOF Corporation)

Silica particles: "SFP-130MC" (manufactured by Denka Company Limited)

(Samples 1 to 8)

Resin compositions were respectively obtained by mixing together ingredients in their respective amounts presented in Table 1, and adding 30 parts by mass of "SAYTEX 8010" (manufactured by Albemarle Asano Corporation) as a flame retardant, relative to 100 parts by mass that is a total amount of the ingredient (A), the ingredient (B), the ingredient (C), and the ingredient (D), followed by stirring at room temperature (25° C.). A resin varnish was obtained by dissolving each of the obtained resin compositions in toluene. The mass ratio of the resin composition to toluene was 50:50.

A resin film was obtained by forming the obtained resin varnish on a PET film (carrier film) by using a bar coater, followed by drying at 110° C. for 4 minutes.

A resin plate was manufactured by repeating lamination of the obtained resin film with the use of a laminator and peeling off of the carrier film.

Subsequently, a copper-clad laminated plate having a thickness of 1 mm was obtained by sandwiching both surfaces of the obtained resin plate with a copper foil having a thickness of 18 µm, followed by heating (200° C.) at a pressure of 4 MPa for 200 minutes.

The copper foil was peeled off from the obtained copper-clad laminated plate, and dielectric constant and dielectric loss tangent of the resin plate were measured at 10 GHz by an impedance analyzer method. The results are presented in Table 1.

Table 1 shows that the resin compositions in Samples 1 to 6 have a low dielectric constant and a low dielectric loss tangent, and shows that Samples 7 and 8, each using no olefin resin having a hydroxyl group or carboxyl group, have a high dielectric constant and a high dielectric loss tangent.

The invention claimed is:

1. A resin composition comprising:
    an ingredient (A) that is a polyphenylene ether whose hydroxyl group bonded to a terminal of a main chain is modified with an ethylenically unsaturated compound;
    an ingredient (B) that is an olefin resin having a hydroxyl group or a carboxyl group;
    an ingredient (C) that is at least one kind of triallyl isocyanurate and triallyl cyanurate; and
    an ingredient (D) that is an organic peroxide, and
    wherein the ingredient (B) is contained in an amount of 2.0-10.0% by mass when a total amount of the ingredient (A), the ingredient (B), the ingredient (C), and the ingredient (D) ((A)+(B)+(C)+(D)) is 100% by mass.

2. The resin composition according to claim 1, wherein the ingredient (A) is contained in an amount of 19.9-88% by mass when a total amount of the ingredient (A), the ingredient (B), the ingredient (C), and the ingredient (D) ((A)+(B)+(C)+(D)) is 100% by mass.

3. The resin composition according to claim 1, further comprising silica.

4. A prepreg comprising:
    a resin composition according to claim 1; and
    a base material.

5. A metal-clad laminated plate comprising a conductive metal foil on a surface of a prepreg according to claim 4.

6. The metal-clad laminated plate according to claim 5, wherein a resin composition in the prepreg comprises a crosslinked product of the ingredient (A), the ingredient (B), the ingredient (C), and the ingredient (D).

TABLE 1

| Samples | Ingredient (A) (% by mass) | Ingredients (B) (% by mass) | Ingredients (C) (% by mass) | Ingredients (D) (% by mass) | Silica Particles Parts by mass | Average particle size | Dielectric constant (10 GHz) | Dielectric loss tangent (10 GHz) |
|---|---|---|---|---|---|---|---|---|
| 1 | SA9000 (66) | COC (2) | TAIC (29) | Perhexyne 25B (3) | 30 | 0.5 µm | 2.8 | 0.0028 |
| 2 | SA9000 (62) | COC (6) | TAIC (29) | Perhexyne 25B (3) | 30 | 0.5 µm | 2.7 | 0.0025 |
| 3 | SA9000 (60) | COC (8) | TAIC (29) | Perhexyne 25B (3) | 30 | 0.5 µm | 2.7 | 0.0022 |
| 4 | SA9000 (58) | COC (10) | TAIC (29) | Perhexyne 25B (3) | 30 | 0.5 µm | 2.6 | 0.0020 |
| 5 | SA9000 (66) | COC (4) | TAIC (24) | Perhexyne 25B (6) | 30 | 0.5 µm | 2.8 | 0.0032 |
| 6 | SA9000 (66) | COC (3) | TAIC (29.4) | Perhexyne 25B (1.6) | 30 | 0.5 µm | 2.8 | 0.0026 |
| 7 | SA9000 (65) | HIPS (3) | TAIC (29) | Perhexyne 25B (3) | 30 | 0.5 µm | 2.9 | 0.0035 |
| 8 | SA9000 (68) | — | TAIC (29) | Perbutyl P (3) | 30 | 0.5 µm | 2.9 | 0.0042 |

* Parts by mass of Silica particles refer to the content when the total amount of an ingredint (A), an ingredient (B), an ingredient (C) and an ingredient (D) is 100% by mass.

7. A wiring board comprising:
a plurality of insulating layers; and
a conductive layer disposed between the insulating layers,
wherein each of the insulating layers comprises a resin composition according to claim 1, and a base material.

* * * * *